US012787351B2

(12) United States Patent
Kanawati et al.

(10) Patent No.: US 12,787,351 B2
(45) Date of Patent: Nov. 3, 2026

(54) RADIO FREQUENCY (RF) SEMICONDUCTOR-ON-INSULATOR (SOI) DEVICE WITH IMPROVED POWER HANDLING

(71) Applicant: Newport Fab, LLC, Newport Beach, CA (US)

(72) Inventors: Roda Kanawati, Irvine, CA (US); Kurt Moen, Tustin, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 408 days.

(21) Appl. No.: 18/382,892

(22) Filed: Oct. 23, 2023

(65) Prior Publication Data

US 2025/0133766 A1 Apr. 24, 2025

(51) Int. Cl.

| | |
|---|---|
| ***H10D 30/63*** | (2025.01) |
| ***H10D 30/01*** | (2025.01) |
| ***H10D 30/60*** | (2025.01) |
| ***H10D 62/10*** | (2025.01) |

(Continued)

(52) U.S. Cl.
CPC ....... *H10D 30/637* (2025.01); *H10D 30/0229* (2025.01); *H10D 62/124* (2025.01); *H10D 62/83* (2025.01); *H10D 64/62* (2025.01); *H10D 30/601* (2025.01)

(58) Field of Classification Search
CPC ............. H10D 30/637; H10D 30/0229; H10D 62/124; H10D 62/83; H10D 64/62; H10D 30/601; H10D 30/0212; H10D 30/6744; H10D 30/6758; H10D 86/201; H10D 30/0323
See application file for complete search history.

(56) References Cited

U.S. PATENT DOCUMENTS

| | | | | |
|---|---|---|---|---|
| 10,672,885 | B2 * | 6/2020 | Kanawati | H10D 30/0212 |
| 12,336,218 | B2 * | 6/2025 | Xu | H10D 30/025 |
| 2017/0338321 | A1 * | 11/2017 | Hurwitz | H03K 17/102 |

(Continued)

OTHER PUBLICATIONS

Silvaco, RFSOI Switch Harmonics Simulations with Trap-Rich Substrate', The Simulation Standard, p. 10-13, Oct, November, Dec. 2019. (Year: 2019).*

(Continued)

*Primary Examiner* — Joe E. Schoenholtz
(74) *Attorney, Agent, or Firm* — Farjami & Farjami LLP

(57) ABSTRACT

A radio frequency (RF) switch includes a semiconductor-on-insulator (SOI) substrate including a handle wafer, a buried oxide over the handle wafer, and a thin semiconductor layer over the buried oxide. A transistor is situated in the thin semiconductor layer and includes a gate, a source, a drain. The buried oxide can have a thickness of approximately two thousand angstroms (2,000 Å) to approximately six thousand angstroms (6,000 Å). The thin semiconductor layer has a thickness less than approximately four hundred angstroms (400 Å), so as to increase maximum power handling ($P_{MAX}$) of the transistor. Nickel silicides can be situated on the source and the drain in an upper portion of the thin semiconductor layer. The RF switch can be one of a plurality of RF switches situated between an RF input and an RF output of an RF device.

8 Claims, 8 Drawing Sheets

(51) Int. Cl.

| | |
|---|---|
| ***H10D 62/83*** | (2025.01) |
| ***H10D 64/62*** | (2025.01) |

(56) References Cited

U.S. PATENT DOCUMENTS

| | | | | |
|---|---|---|---|---|
| 2019/0123166 | A1* | 4/2019 | Kanawati | H10D 30/0212 |
| 2023/0102053 | A1* | 3/2023 | Xu | H10D 30/025<br>257/329 |
| 2023/0215759 | A1* | 7/2023 | Seacrist | H10P 14/3208<br>438/455 |
| 2025/0063822 | A1* | 2/2025 | Singh | H10D 30/6758 |

OTHER PUBLICATIONS

Dennis, John R., and Edward B. Hale. "Crystalline to amorphous transformation in ion-implanted silicon: A composite model." Journal of Applied Physics, vol. 49, No. 3, Mar. 1, 1978, pp. 1119-1127, https://doi.org/10.1063/1.325049.*

Christensen, M., et al. "Formation of nickel-platinum silicides on a silicon substrate: Structure, phase stability, and diffusion from ab initio computations." Journal of Applied Physics, vol. 114, No. 3, Jul. 19, 2013, https://doi.org/10.1063/1.4816094. (Year: 2013).*

Dennis, John R., and Edward B. Hale. "Crystalline to amorphous transformation in ion-implanted silicon: A composite model." Journal of Applied Physics, vol. 49, No. 3, Mar. 1, 1978, pp. 1119-1127, https://doi.org/10.1063/1.325049. (Year: 1978).*

* cited by examiner

RADIO FREQUENCY (RF) SEMICONDUCTOR-ON-INSULATOR (SOI) DEVICE WITH IMPROVED POWER HANDLING

BACKGROUND

Radio frequency (RF) switches comprising field effect transistors (FETs) are commonly utilized in wireless communication devices (e.g., smart phones) to route signals through transmit and receive paths, for example between the device's processing circuitry and the device's antenna. Implementing switches on semiconductor-on-insulator (SOI) substrates can provide various advantages, such as improved isolation, fewer short-channel effects, lower voltage requirements, and faster switching speed. SOI is generally suitable for switches utilized in logic and digital applications.

However, as device dimensions scale down, SOI becomes less appropriate for RF switching applications. Materials used in RF switches often contribute to parasitic capacitances associated with RF frequencies, disadvantageously increasing OFF-state capacitance ($C_{OFF}$). Floating body and self-heating effects become more prevalent. RF SOI switches experience increased insertion losses and decreased linearity, resulting in poorer performance and, in particular, lower maximum power handling ($P_{MAX}$).

Techniques to increase $P_{MAX}$ generally result in RF performance tradeoffs, such as disadvantageously increasing ON-state resistance ($R_{ON}$). Conventional techniques to decrease $R_{ON}$, such as decreasing a gate length, raising a source or drain, and increasing dopant concentrations of the source or drain, result in further RF performance tradeoffs, may not be feasible given process constraints, and tend to increase complexity.

Thus, there is a need in the art for RF switches, and in general RF devices using RF switches, with improved RF performance and power handling.

SUMMARY

The present disclosure is directed to a radio frequency (RF) semiconductor-on-insulator (SOI) device with improved power handling, substantially as shown in and/or described in connection with at least one of the figures, and as set forth in the claims.

DETAILED DESCRIPTION

Figure 1:
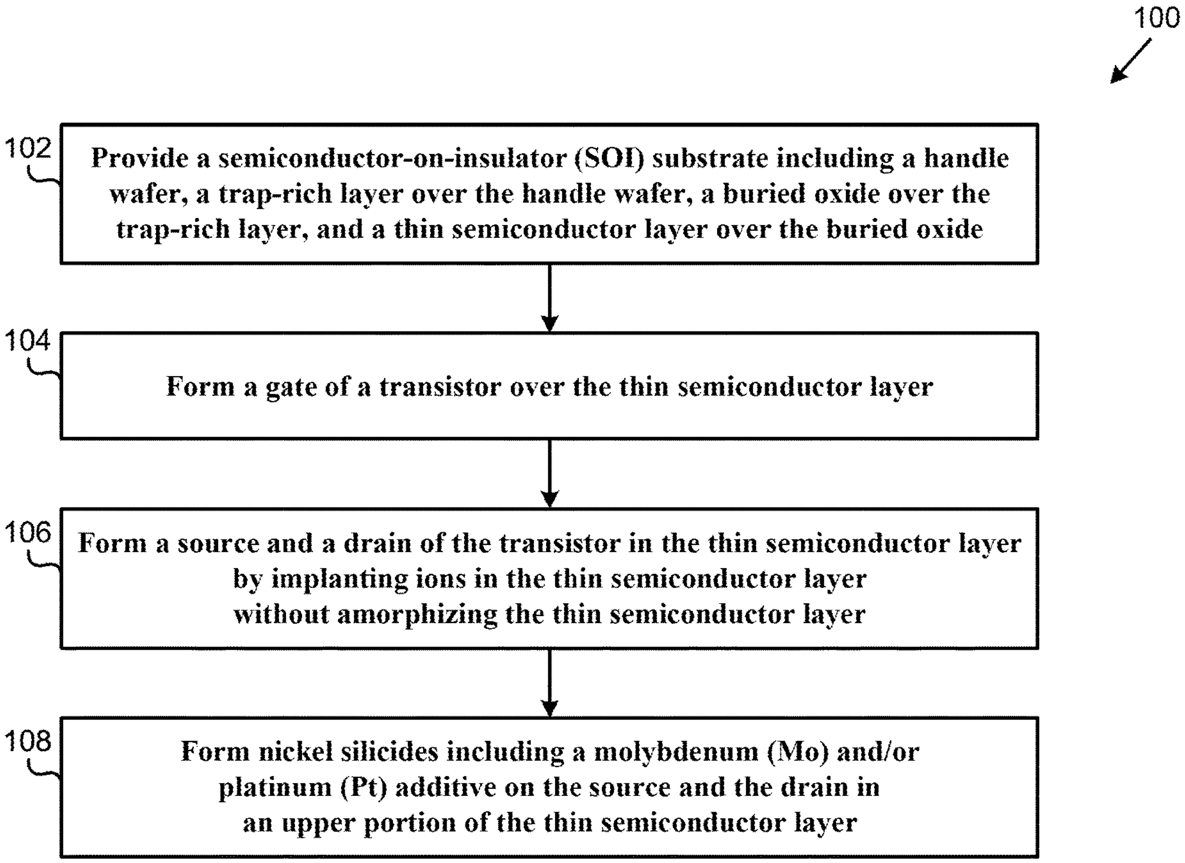
FIG. 1 illustrates a flowchart of an exemplary method for forming a radio frequency (RF) switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions. Further, in the present application the terms "connected" to/with or "coupled" to/with may be used interchangeably to have the same or similar meaning, and each term may mean direct or indirect connection.

Figure 2:
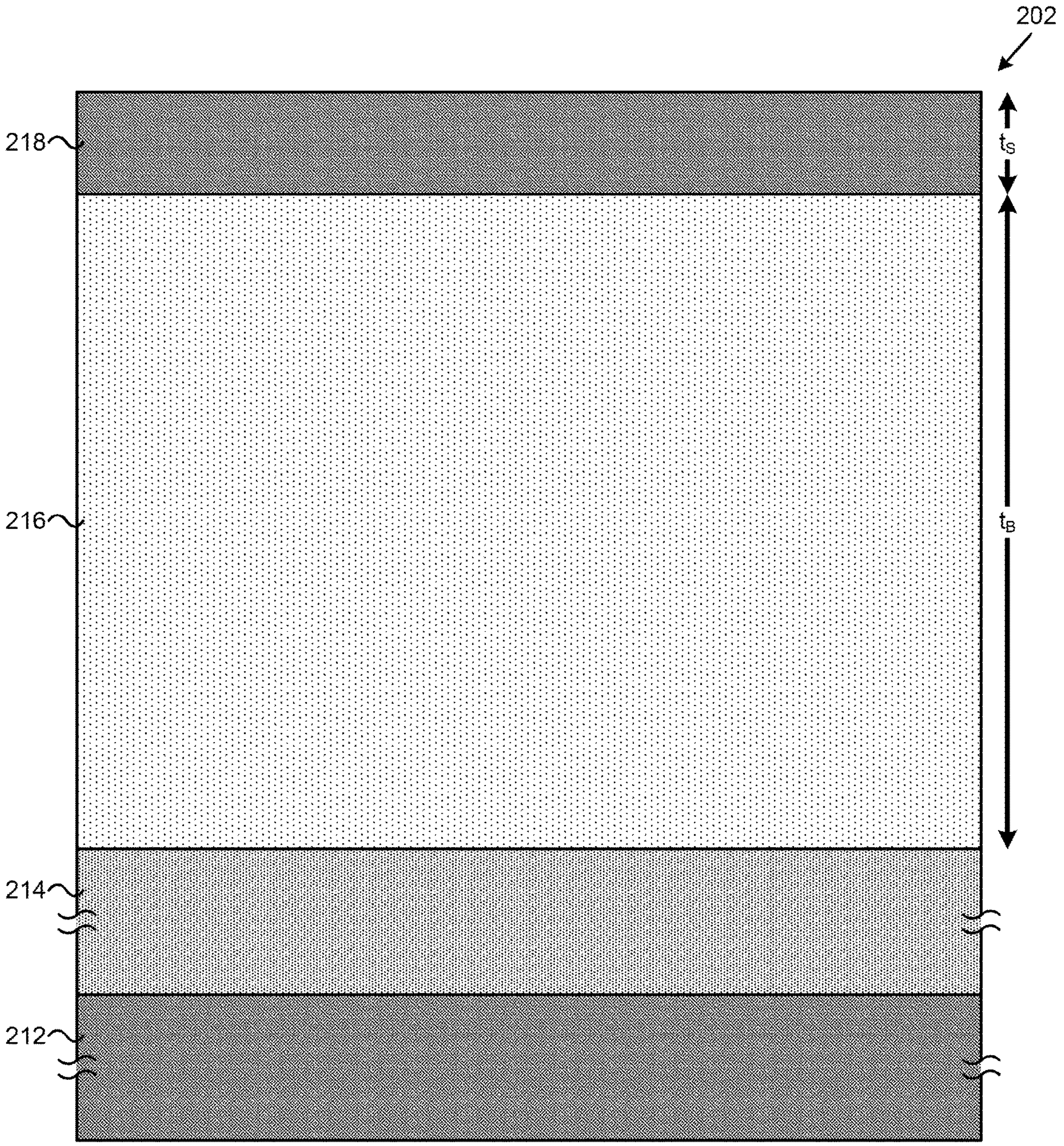
FIG. 2 illustrates a cross-sectional view of a portion of a semiconductor structure processed in accordance with the flowchart of FIG. 1 according to one implementation of the present application.
Figure 3:
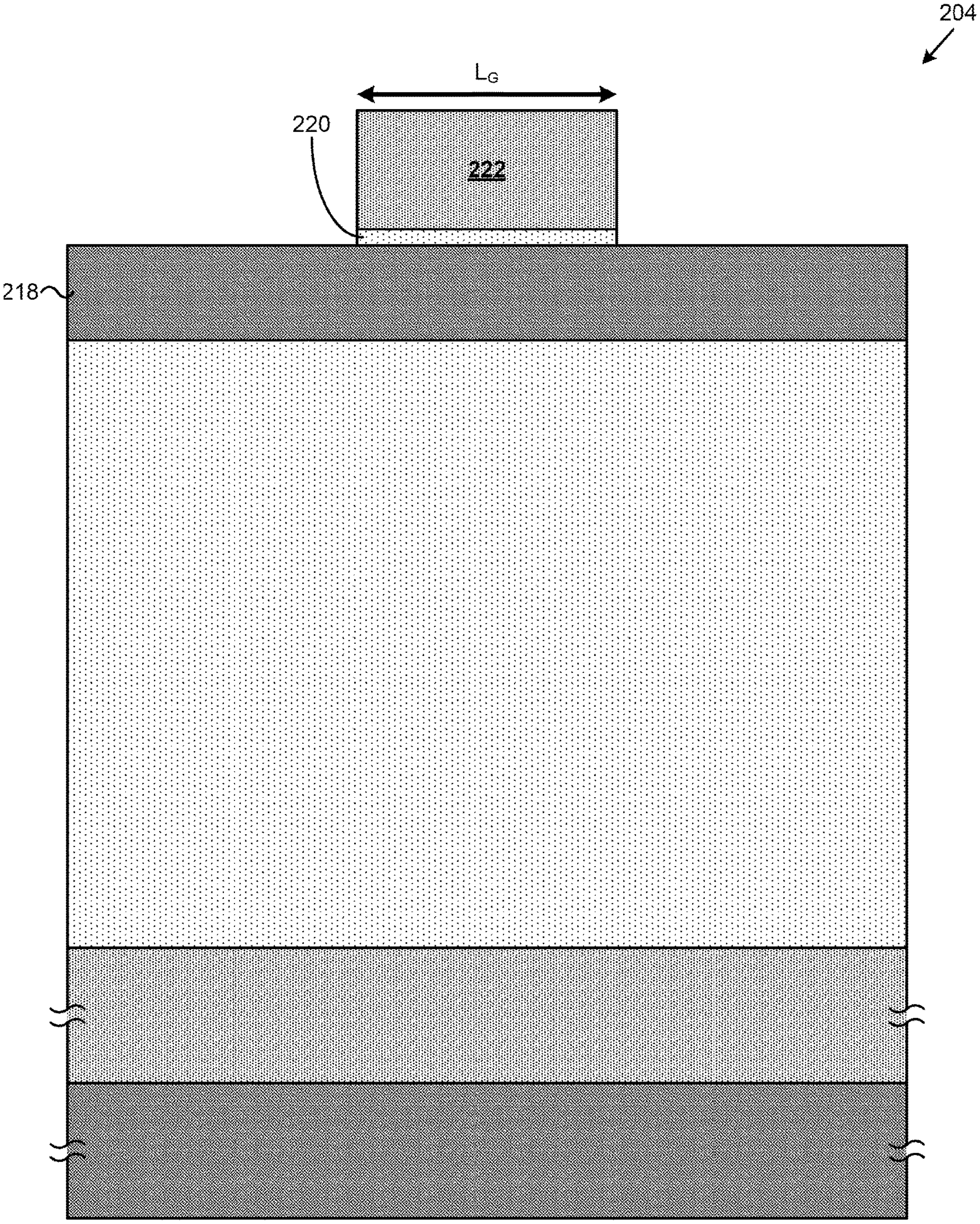
FIG. 3 illustrates a cross-sectional view of a portion of a semiconductor structure processed in accordance with the flowchart of FIG. 1 according to one implementation of the present application.

FIG. 1 illustrates a flowchart of an exemplary method for forming a radio frequency (RF) switch according to one implementation of the present application. Structures shown in FIGS. 2 through 5 illustrate the results of performing actions 102 through 108 shown in flowchart 100 of FIG. 1. For example, FIG. 2 shows a semiconductor structure after performing action 102 in FIG. 1, FIG. 3 shows a semiconductor structure after performing action 104 in FIG. 1, and so forth.

Actions 102 through 108 shown in flowchart 100 of FIG. 1 are sufficient to describe one implementation of the present inventive concepts. Other implementations of the present inventive concepts may utilize actions different from those shown in the flowchart of FIG. 1. Certain details and features have been left out of the flowchart that are apparent to a person of ordinary skill in the art. For example, an action may consist of one or more sub-actions or may involve specialized equipment or materials, as known in the art. Moreover, some actions, such as masking and cleaning actions, are omitted so as not to distract from the illustrated actions.

FIG. 2 illustrates a cross-sectional view of a portion of a semiconductor structure processed in accordance with action 102 in the flowchart of FIG. 1 according to one implementation of the present application. As shown in FIG. 2, a semiconductor-on-insulator (SOI) substrate 202 is provided. SOI substrate 202 includes handle wafer 212, trap-rich layer 214, buried oxide (BOX) 216, and thin semiconductor layer 218. Handle wafer 212, trap-rich layer 214, BOX 216, and thin semiconductor layer 218 can be provided together as a pre-fabricated SOI substrate. In various implementations, a bonded and etch back SOI (BESOI) process, a separation by implantation of oxygen (SIMOX) process, or a "smart cut process can be used for providing SOI substrate 202 as known in the art In one implementation, handle wafer 212 is a high-resistivity wafer, such as undoped bulk silicon. In various implementations, handle wafer 212 can comprise germanium, group III-V material, or any other suitable handle material. In various implementations, handle wafer 212 has a thickness of approximately seven hundred microns (700 μm) or greater or less. Trap-rich layer 214 is situated over handle wafer 212 and under BOX 216. In various implementations, trap-rich layer 214 can comprise polycrystalline silicon (polysilicon) or porous silicon. In various implementations, trap-rich layer 214 has a thickness of approximately one micron (1 μm) to approximately four microns (4 μm) or greater or less.

BOX 216 is situated over tap-rich layer 214 and handle wafer 212. In various implementations, BOX 216 typically comprises silicon dioxide ($SiO_2$), but it may also comprise silicon nitride ($Si_XN_Y$), or another insulator material. BOX 216 is thick relative to thin semiconductor layer 218. In various implementations, BOX 216 has a thickness $t_B$ of approximately two thousand angstroms (2,000 Å) to approximately six thousand angstroms (6,000 Å). Thin semiconductor layer 218 is situated over BOX 216. In one implementation, thin semiconductor layer 218 includes monocrystalline silicon. In one implementation, thin semiconductor layer 218 is undoped. In various implementations, thin semiconductor layer 218 can comprise germanium, group III-V material, or any other semiconductor material. In various implementations, thin semiconductor layer 218 has a thickness $t_S$ less than approximately four hundred angstroms (400 Å). In one implementation, thin semiconductor layer 218 has a thickness $t_S$ of approximately one hundred angstroms (100 Å).

FIG. 3 illustrates a cross-sectional view of a portion of a semiconductor structure processed in accordance with action 104 the flowchart of FIG. 1 according to one implementation of the present application. As shown in FIG. 3, in semiconductor structure 204, gate oxide 220 and gate 222 of a transistor are formed over thin semiconductor layer 218. Gate oxide 220 can comprise, for example, $SiO_2$ or another dielectric. Gate 222 is situated over gate oxide 220. Gate 222 can comprise, for example, polysilicon or a conductive metal. Gate oxide 220 and gate 222 can be formed by any technique known in the art. For example, gate oxide 220 and gate 222 can be formed by depositing an $SiO_2$ layer and a polysilicon layer, and then patterning them. In one implementation, gate 222 can have a gate length $L_G$ of approximately two hundred nanometers (200 nm).

Figure 4:
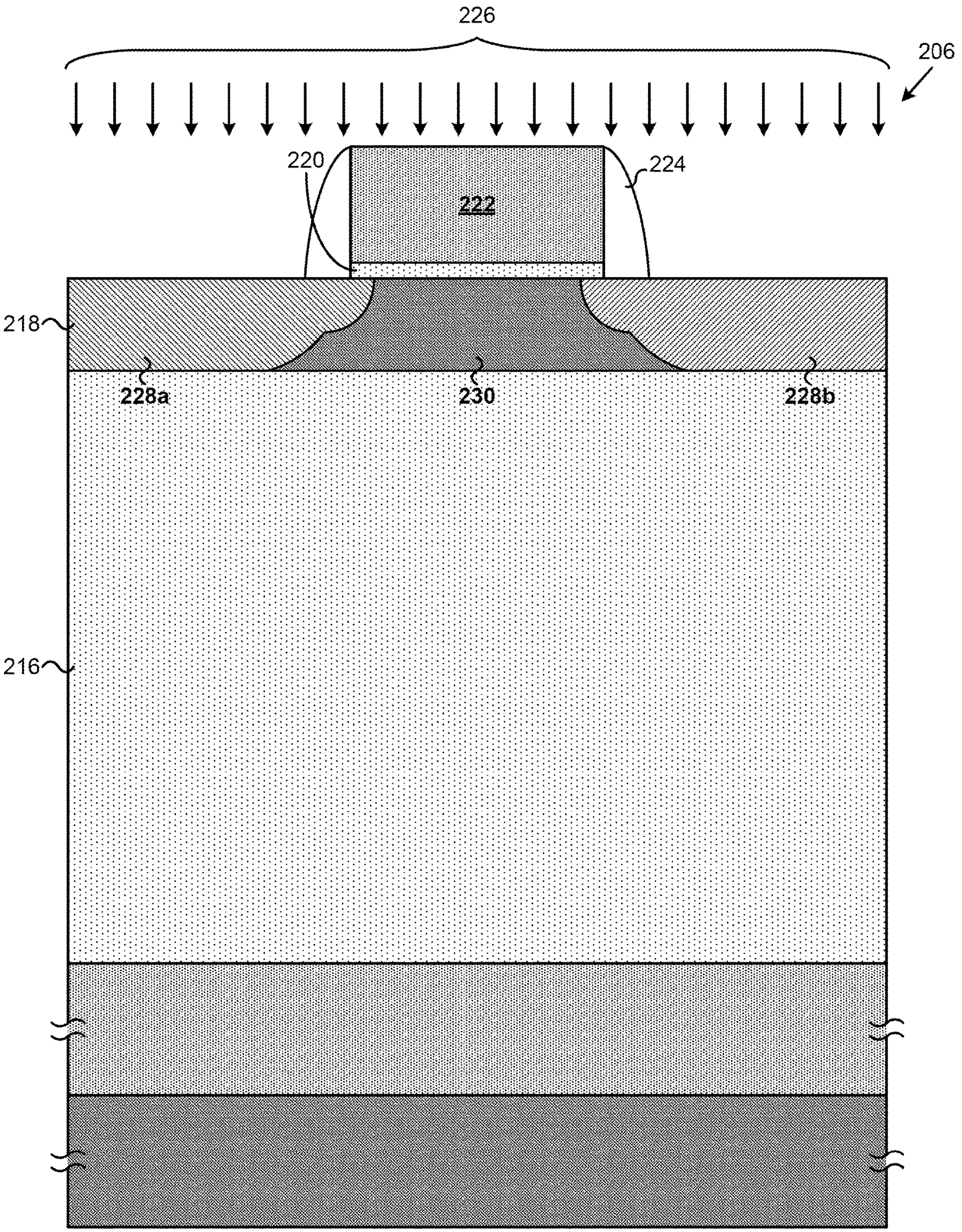
FIG. 4 illustrates a cross-sectional view of a portion of a semiconductor structure processed in accordance with the flowchart of FIG. 1 according to one implementation of the present application.

FIG. 4 illustrates a cross-sectional view of a portion of a semiconductor structure processed in accordance with action 106 in the flowchart of FIG. 1 according to one implementation of the present application. As shown in FIG. 3, in semiconductor structure 206, source **228*a* and drain 228*b* of a transistor are formed in thin semiconductor layer 218 by implanting ions 226 into thin semiconductor layer 218 without amorphizing thin semiconductor layer 218**.

Source **228*a* and drain 228*b* can include lightly-doped regions substantially aligned with gate 222 and gate oxide 220. Dielectric spacer 224 is situated on sides of gate 222 and gate oxide 220. Dielectric spacer 224 can comprise, for example, silicon nitride. Ions 226 are implanted into thin semiconductor layer 218 by any technique known in the art in order to form remaining regions of source 238*a* and drain 238*b* substantially aligned with dielectric spacer 224. Source 238*a* and drain 238*b* extend to the interface of thin semiconductor layer 218 and BOX 216. In one implementation, source 228*a* and drain 228*b* have N-type conductivity, and ions 226 comprise phosphorus (P). Channel region 230 of the transistor is situated between source 228*a* and drain 228*b***. The transistor is a fully depleted transistor.

Ions 226 are implanted into thin semiconductor layer 218 without amorphizing thin semiconductor layer 218. As described above, thin semiconductor layer 218 can be monocrystalline silicon. Implanting ions into a crystalline silicon can transform it from the monocrystalline state to the amorphous state if the energy density implanted by ions 226 is sufficiently large. The critical amorphizing energy density depends on factors such as implant dose, implant energy, implant species, and temperature. In the present implementation, these factors are controlled such that ions 226 implanted into thin semiconductor layer 218 do not fully amorphize it. For an implant process with a given implant energy, implant species, and temperature, the implant dose is controlled to be less than a critical amorphizing dose. As an example, for a phosphorus species implanted at room temperature using ten kilo-electron-volts (10 keV), the critical amorphizing dose may be approximately 1.0E17 ions/cm$^2$, and ions 226 may be implanted using a lower dose. When source **228*a* and drain 228*b* include lightly-doped regions, both implants for the lightly-doped regions and the remaining regions may be controlled so as not to amorphize thin semiconductor layer 218**.

Figure 5:
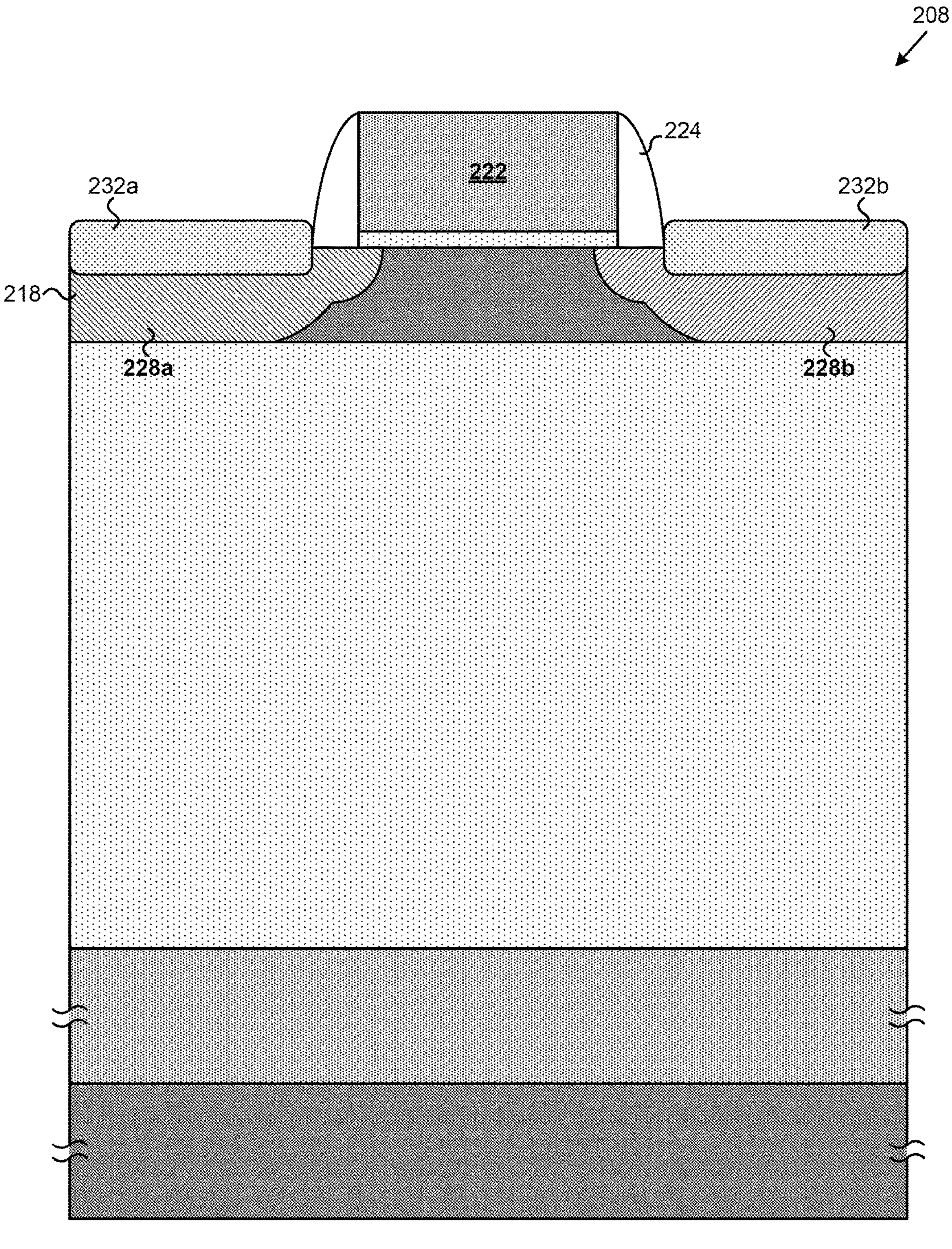
FIG. 5 illustrates a cross-sectional view of a portion of a semiconductor structure processed in accordance with the flowchart of FIG. 1 according to one implementation of the present application.

FIG. 5 illustrates a cross-sectional view of a portion of a semiconductor structure processed in accordance with action 108 in the flowchart of FIG. 1 according to one implementation of the present application. As shown in FIG. 5, in semiconductor structure 208, nickel silicides **232*a* and 232*b* are formed on source 228*a* and drain 228*b* in an upper portion of thin semiconductor layer 218**.

Nickel silicides **232*a* and 232*b* can be formed depositing a nickel layer over semiconductor structure 208, for example, by sputtering, then reacting the nickel layer with source 228*a* and drain 228*b* of thin semiconductor layer 218 by performing a rapid thermal anneal (RTA), and then removing unreacted portions of the nickel layer. In various implementations, one or more additives of molybdenum (Mo) and/or platinum (Pt) are included in the deposited nickel layer, such that nickel silicides 232*a* and 232*b* comprise Mo and/or Pt. In one implementation, nickel silicide can also be formed on gate 222, separated and insulated from nickel silicides 232*a* and 232*b* using dielectric spacer 224**.

Figure 6:
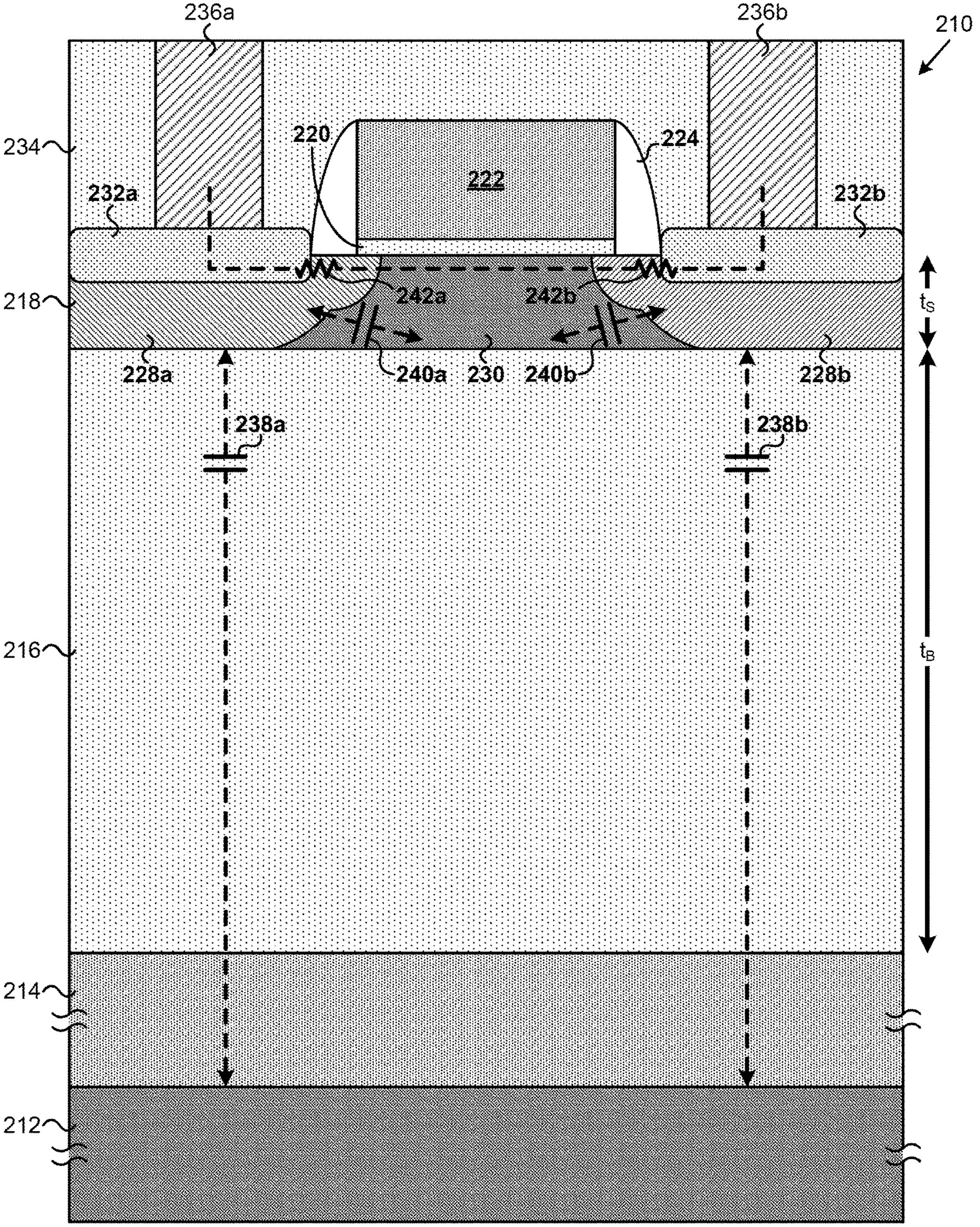
FIG. 6 illustrates a cross-sectional view of a portion of an RF switch according to one implementation of the present application.

FIG. 6 illustrates a cross-sectional view of a portion of an RF switch according to one implementation of the present application. As shown in FIG. 6, in semiconductor structure 210, source contact **236*a* and drain contact 236*b* are connected to nickel silicides 232*a* and 232*b*. Pre-metal dielectric (PMD) 234 is formed over the transistor and source contact 236*a* and drain contact 236*b* are formed in pre-metal dielectric 234. In various implementations, PMD 234 can comprise borophosphosilicate glass (BPSG), tetra-ethyl ortho-silicate (TEOS), $SiO_2$, $Si_XN_Y$, silicon oxynitride ($Si_XO_YN_Z$), or another dielectric. In one implementation, source contact 236*a* and drain contact 236*b* comprise tungsten (W). A gate contact (not shown in FIG. 6), can be connected to gate 222. Additional interconnect metals (not shown in FIG. 6) can also be connected to the contacts. Semiconductor structure 210 in FIG. 6 represents a substantially complete RF switch, and may also be referred to as RF switch 210** in the present application.

The product of ON-state resistance and OFF-state capacitance ($R_{ON} \times C_{OFF}$) is a figure of merit RF-SOI switch designs strive to minimize in order to improve RF performance. Minimizing this figure of merit generally corresponds to increased maximum power handling ($P_{MAX}$) of the transistor. RF switch 210 exhibits various advantages that contribute to minimized $R_{ON} \times C_{OFF}$ and increased $P_{MAX}$.

In RF switch 210 in FIG. 6, BOX 216 is relatively thick compared to thin semiconductor layer 218. This contradicts conventional wisdom which teaches that the thickness of the BOX should scale down as the thickness of the semiconductor layer scales down, for example, in order to reduce short channel effects such as drain induced barrier lowering, enable back gate biasing, and simplify manufacturing of the SOI substrate. For example, in a conventional RF switch, when the thickness of the semiconductor layer is approximately one hundred angstroms (100 Å), the thickness of the BOX may be approximately two hundred and fifty angstroms (250 Å), whereas in RF switch 210, BOX 216 has a thickness $t_B$ of approximately two thousand angstroms (2,000 Å) to approximately six thousand angstroms (6,000 Å). As a result of this increased relative thickness of BOX 216, less parasitic capacitive coupling occurs between handle wafer 212 and source 228*a* or drain 228*b* when RF switch 210 is in an OFF-state. In other words, the capacitance value of parasitic capacitors 238*a* and 238*b* is decreased, and correspondingly $C_{OFF}$ is decreased. When trap-rich layer 214 is utilized, parasitic conduction at the surface of handle wafer 212 is decreased, and the capacitance value of parasitic capacitors 238*a* and 238*b* and $C_{OFF}$ are further decreased.

In RF switch 210, thin semiconductor layer 218 is relatively thin. For example, in a conventional RF switch, when the thickness of the BOX is approximately two thousand angstroms (2,000 Å) to approximately six thousand angstroms (6,000 Å), the thickness of the semiconductor layer may be approximately six hundred angstroms (600 Å) to approximately one thousand four hundred angstroms (1,400 Å), whereas in RF switch 210, thin semiconductor layer 218 has a thickness $t_S$ of less than approximately four hundred angstroms (400 Å). As a result of this decreased relative thickness of thin semiconductor layer 218, less parasitic capacitive coupling occurs between channel region 230 and source 228*a* or drain 228*b* when RF switch 210 is in an OFF-state. In other words, the capacitance value of parasitic capacitors 240*a* and 240*b* is decreased, and correspondingly $C_{OFF}$ is decreased.

Ordinarily, the decreased thickness $t_S$ of thin semiconductor layer 218 would result in increased $R_{ON}$ for RF switch 210. For example, absent the present invention, the value of $R_{ON}$ could approximately double. However, in the present invention, due to the engineering of source 228*a* and drain 228*b*, RF switch 210 may have approximately the same $R_{ON}$ as a conventional RF switch with a thicker semiconductor layer. First, thin semiconductor layer 218 is not amorphized during ion implantation of source 228*a* and drain 228*b*. In a conventional RF switch, the semiconductor layer is often amorphized during ion implantation of the source and drain, and then the semiconductor layer is treated in order to recrystallize it, resulting a higher $R_{ON}$ compared to a scenario where the semiconductor layer had not been amorphized. In contrast, in RF switch 210, thin semiconductor layer 218 is not amorphized, and source 228*a* and drain 228*b* remain monocrystalline throughout fabrication. As a result, source 228*a* and drain 228*b* exhibit less resistance when RF switch 210 is in an ON-state. In other words, the resistance value of extrinsic resistors 242*a* and 242*b* is decreased, and correspondingly $R_{ON}$ is decreased.

Second, nickel silicides 232*a* and 232*b* are formed on source 228*a* and drain 228*b* in an upper portion of thin semiconductor layer 218. Metal silicides, such as nickel silicides and conventional cobalt silicides, generally decrease $R_{ON}$ by decreasing contact resistance between metals and silicon, such as between source contact 236*a* and drain contact 236*b* and source 228*a* and drain 228*b*. However, conventional cobalt silicides consume significantly more silicon volume during formation, and can result in a cobalt silicide that is thicker than the thickness $t_S$ of thin semiconductor layer 218, which would undesirably short source 228*a* and drain 228*b* to channel region 230 rendering RF switch 210 inoperable. In the present implementation, only small volumes of silicon of source 228*a* and drain 228*b* are consumed during formation of nickel silicides 232*a* and 232*b*. Nickel silicides 232*a* and 232*b* are thinner than the thickness $t_S$ of thin semiconductor layer 218, and do not undesirably short to channel region 230. Accordingly, nickel silicides 232*a* and 232*b* can successfully decrease the value of extrinsic resistors 242*a* and 242*b*, and correspondingly decrease $R_{ON}$. When additives of Mo and/or Pt are utilized, these additives further prevent spiking and/or agglomeration in nickel silicides 232*a* and 232*b*, and $R_{ON}$ is further decreased.

Compared to a conventional RF switch, RF switch 210 utilizing thin semiconductor layer 218, thick BOX 216, and the engineering of source 228*a* and drain 228*b* described above is able to significantly decrease $C_{OFF}$, while maintaining or decreasing $R_{ON}$. For example, RF switch 210 can have a $C_{OFF}$ that is approximately ten percent (10%) less than that of a conventional RF switch. Thus, RF switch 210 exhibits decreased $R_{ON} \times C_{OFF}$ and increased $P_{MAX}$ of the transistor.

Figure 7:
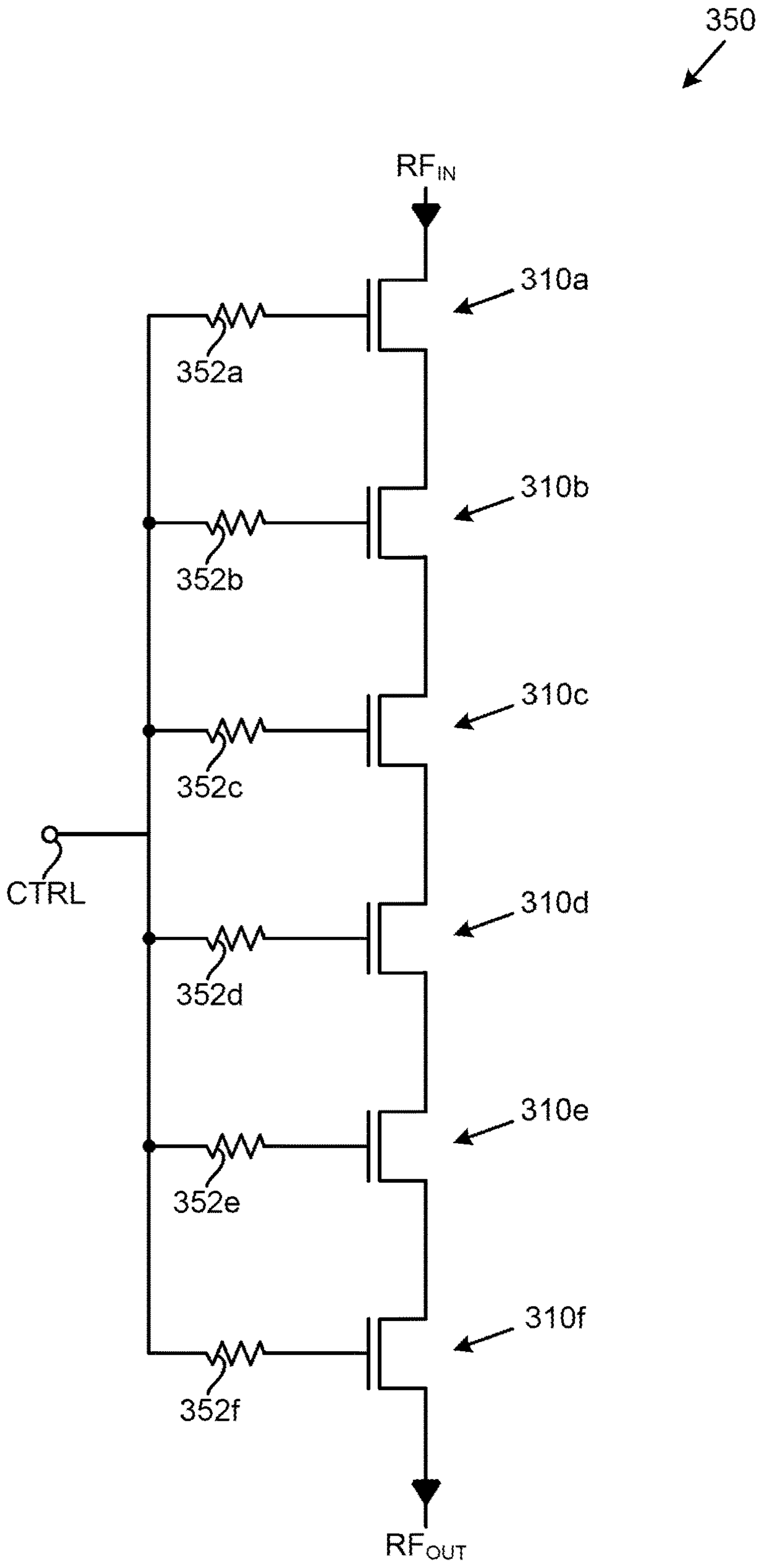
FIG. 7 illustrates a portion of an RF device employing RF switches according to one implementation of the present application.

FIG. 7 illustrates a portion of an RF device employing RF switches according to one implementation of the present application. RF device 350 in FIG. 7 is a cascaded RF switch stack. RF device 350 includes a plurality of RF switches 310*a*, 310*b*, 310*c*, 310*d*, 310*e*, and 310*f* (collectively referred to as RF switches 310) coupled between an RF input $RF_{IN}$ and an RF output $RF_{OUT}$. $RF_{IN}$ and $RF_{OUT}$ can be any RF input source or RF output node, such as an antenna, a power amplifier (PA), a low noise amplifier (LNA), a mixer, or a mixer. Transistor gates of RF switches 310 are coupled through respective gate resistors 352*a*, 352*b*, 352*c*, 352*d*, 352*e*, and 352*f* to a control node CTRL for switching RF switches 310 between ON and OFF states. CTRL can be coupled to a microcontroller and/or pulse generator (not shown in FIG. 7).

RF device 350 in FIG. 7 represents an exemplary use case for RF switch 210 in FIG. 6. Each of RF switches 310 in FIG. 7 generally corresponds to RF switch 210 in FIG. 6, and may have any implementations or advantages described above. Because each of RF switches 310 exhibits increased $P_{MAX}$ of the transistor, RF device 350 has increased overall power handling capability. For example, RF device 350 employing six stacked RF switches 310 according to the present application may have overall power handling capability equal to or greater than that of a conventional RF device employing seven stacked conventional RF switches. When implemented as an integrated circuit, RF device 350 may utilize approximately ten percent (10%) to approximately twenty percent (20%) less die area compared to the conventional RF device. It is noted that the design of RF device 350 is merely exemplary. For example, RF device 350 may utilize more or fewer stacked RF switches 310 than shown.

Figure 8:
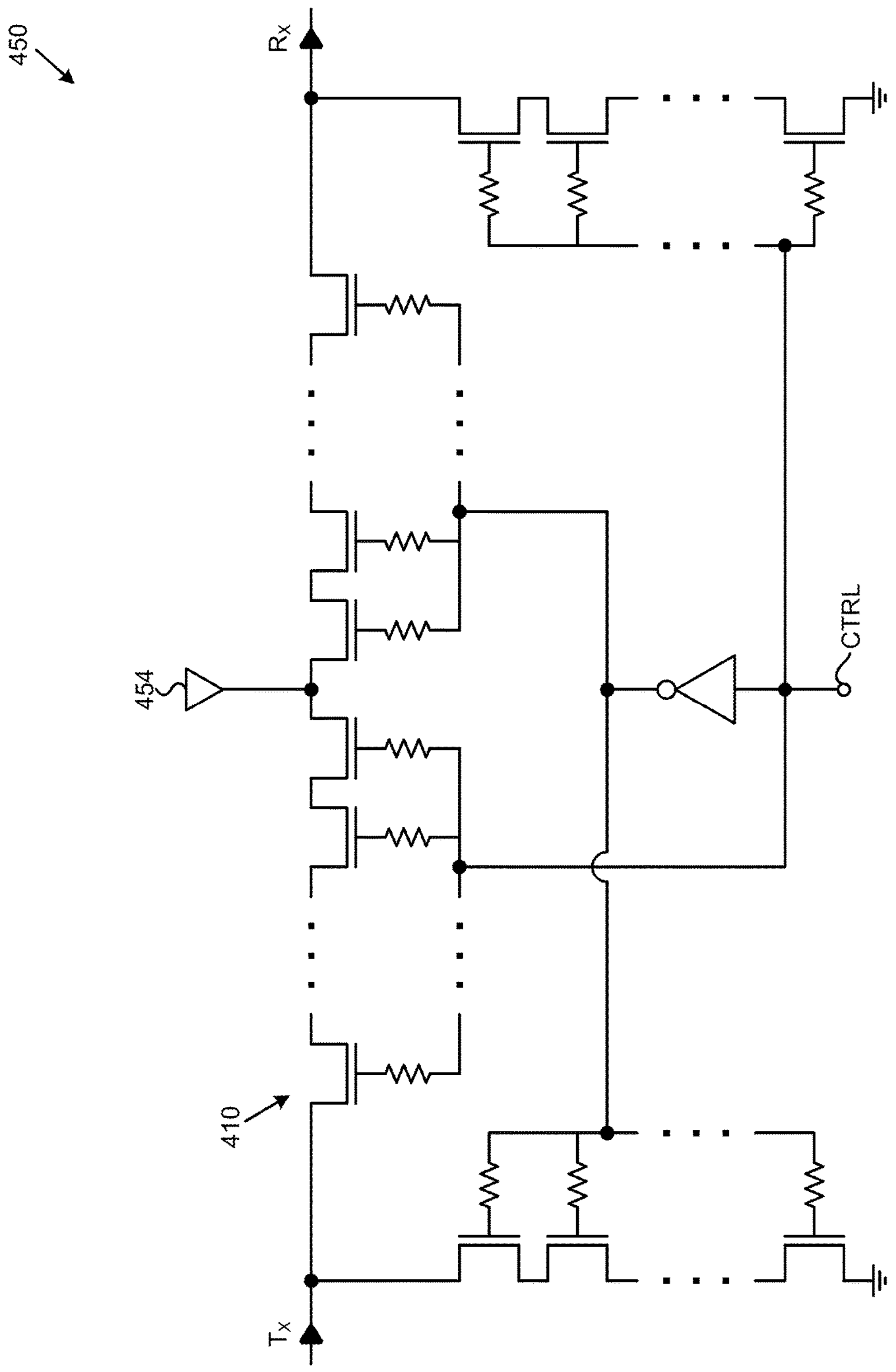
FIG. 8 illustrates a portion of an RF device employing RF switches according to one implementation of the present application.

FIG. 8 illustrates a portion of an RF device employing RF switches according to one implementation of the present application. RF device 450 in FIG. 8 is single pole double throw (SPDT) switch. RF device 450 includes a plurality of RF switches 410 coupled between a transmit node $T_X$, antenna 454, and a receive node $R_X$. RF device 450 functions to switch a transceiver between transmit and receive modes.

In the transmit mode, transmit node $T_X$ functions as an RF input, while antenna 454 functions as an RF output. Control node CTRL is ON. Tx is coupled to antenna 454 by a cascaded RF switch stack and isolated from ground across another cascaded RF switch stack. Rx is isolated from antenna 454 across another cascaded RF switch stack and coupled to ground by another cascaded RF switch stack. Conversely, in the receive mode, antenna 454 functions as an RF input, while receive node $R_X$ functions as an RF output. Control node CTRL is OFF. Tx is isolated from antenna 454 across a cascaded RF switch stack and coupled to ground by another cascaded RF switch stack. Rx is coupled to antenna 454 by another cascaded RF switch stack and isolated from ground across another cascaded RF switch stack.

Because each of RF switches 410 exhibits increased $P_{MAX}$ of the transistor, as described above, RF device 450 can utilize fewer RF switches less die area compared to a conventional RF device. It is noted that the design of RF device 450 is merely exemplary. For example, RF device 450 may utilize a single RF switch between each pair of nodes to be coupled or isolated, rather than a cascaded RF switch stack. Moreover, RF switch 210 in FIG. 6 may be utilized in other RF devices, such as in an LNA, in place of a conventional switch.

Thus, various implementations of the present application achieve reduced $R_{ON}\times C_{OFF}$ utilizing the RF switch of the present application and novel combinations to overcome the deficiencies in the art, and to provide increased $P_{MAX}$ in an RF device. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) switch comprising:

a semiconductor-on-insulator (SOI) substrate including a handle wafer, a trap-rich layer including porous silicon over said handle wafer, a buried oxide over said trap-rich layer, and a thin semiconductor layer over said buried oxide;

a transistor in said thin semiconductor layer, said transistor including a gate, a source, a drain;

said thin semiconductor layer having a first thickness less than approximately four hundred angstroms (400 Å), and said buried oxide having a second thickness greater than approximately twenty times (20×) said first thickness, so as to increase maximum power handling ($P_{MAX}$) of said transistor;

nickel silicides on said source and said drain in an upper portion of said thin semiconductor layer, said nickel silicides including additives of molybdenum (Mo) and platinum (Pt);

said thin semiconductor layer, including said source and said drain, being non-recrystallized monocrystalline semiconductor material.

2. The RF switch of claim 1, wherein said transistor is a fully depleted transistor.

3. A method of forming a radio frequency (RF) switch comprising:

providing a semiconductor-on-insulator (SOI) substrate including a handle wafer, a trap-rich layer including porous silicon over said handle wafer, a buried oxide over said trap-rich layer, and a thin semiconductor layer over said buried oxide;

forming a gate of a transistor over said thin semiconductor layer;

forming a source and a drain of said transistor in said thin semiconductor layer;

said thin semiconductor layer having a first thickness less than approximately four hundred angstroms (400 Å), and said buried oxide having a second thickness greater than approximately twenty times (20×) said first thickness, so as to increase maximum power handling ($P_{MAX}$) of said transistor;

forming nickel silicides on said source and said drain in an upper portion of said thin semiconductor layer, said nickel silicides including additives of molybdenum (Mo) and platinum (Pt);

said thin semiconductor layer, including said source and said drain, being non-recrystallized monocrystalline semiconductor material;

said forming said source and said drain of said transistor comprising implanting ions in said thin semiconductor layer without amorphizing said thin semiconductor layer.

4. The method of claim 3, wherein said transistor is a fully depleted transistor.

5. A radio frequency (RF) device comprising:

at least one RF switch coupled between an RF input and an RF output said at least one RF switch comprising:

a semiconductor-on-insulator (SOI) substrate including a handle wafer, a trap-rich layer including porous silicon over said handle wafer, a thick buried oxide over said trap-rich layer, and a thin semiconductor layer over said buried oxide;

a transistor in said thin semiconductor layer, said transistor including a gate, a source, a drain;

said thin semiconductor layer having a thickness less than approximately four hundred angstroms (400 Å), and said buried oxide having a second thickness greater than approximately twenty times (20×) said first thickness, so as to increase maximum power handling ($P_{MAX}$) of said transistor;

nickel silicides on said source and said drain in an upper portion of said thin semiconductor layer, said nickel silicides including additives of molybdenum (Mo) and platinum (Pt);

said thin semiconductor layer, including said source and said drain, being non-recrystallized monocrystalline semiconductor material.

6. The RF device of claim 5, wherein said at least one RF device comprises a single pole double throw (SPDT) switch.

7. The RF device of claim 5, wherein said at least one RF device comprises a low noise amplifier (LNA).

8. The RF device of claim 5, wherein said transistor is a fully depleted transistor.

* * * * *